United States Patent [19]
Kamiya et al.

[11] Patent Number: 5,838,615
[45] Date of Patent: Nov. 17, 1998

[54] NONVOLATILE SEMICONDUCTOR MEMORY DEVICE HAVING REDUCED SOURCE LINE RESISTANCE

[76] Inventors: Eiji Kamiya; Seiichi Mori, both of c/o Intellectual Property Division, Kabushiki Kaisha Toshiba, 1-1 Shibaura 1-chome, Minato-ku, Tokyo 105, Japan

[21] Appl. No.: 795,018
[22] Filed: Feb. 5, 1997

[30] Foreign Application Priority Data

Feb. 6, 1996 [JP] Japan .................................. 8-019894

[51] Int. Cl.⁶ .................................................. G11C 16/04
[52] U.S. Cl. .............................. 365/185.12; 365/185.17; 365/185.01; 257/315; 257/383
[58] Field of Search ..................... 365/185.12, 185.17, 365/185.01; 257/315, 314, 383

[56] References Cited

U.S. PATENT DOCUMENTS

| | | | |
|---|---|---|---|
| 5,338,956 | 8/1994 | Nakamura | 365/185.17 |
| 5,389,808 | 2/1995 | Arai | 257/316 |
| 5,392,237 | 2/1995 | Iida | 257/316 |
| 5,656,840 | 8/1997 | Yang | 257/316 |

*Primary Examiner*—Huan Hoang
*Attorney, Agent, or Firm*—Banner & Witcoff

[57] ABSTRACT

According to this invention, a metal interconnection for the common source diffusion layer of memory cell transistors can be easily formed. An insulating interlayer which covers memory cell transistors is formed on a substrate. A contact hole connected to each drain diffusion layer and a slit-like opening for forming the metal interconnection for the common source diffusion layer are formed on the insulating interlayer. Each contact hole and the slit-like opening are embedded with a refractory metal. The refractory metal in each contact hole is connected to a bit line on the insulating interlayer. In order to connect the refractory metal film in the slit-like opening to only an upper source line, the refractory metal in the slit-like opening crosses under the bit line so as to have an intermediate level of the insulating interlayer in the direction of thickness except for a contact portion with the source line.

36 Claims, 5 Drawing Sheets

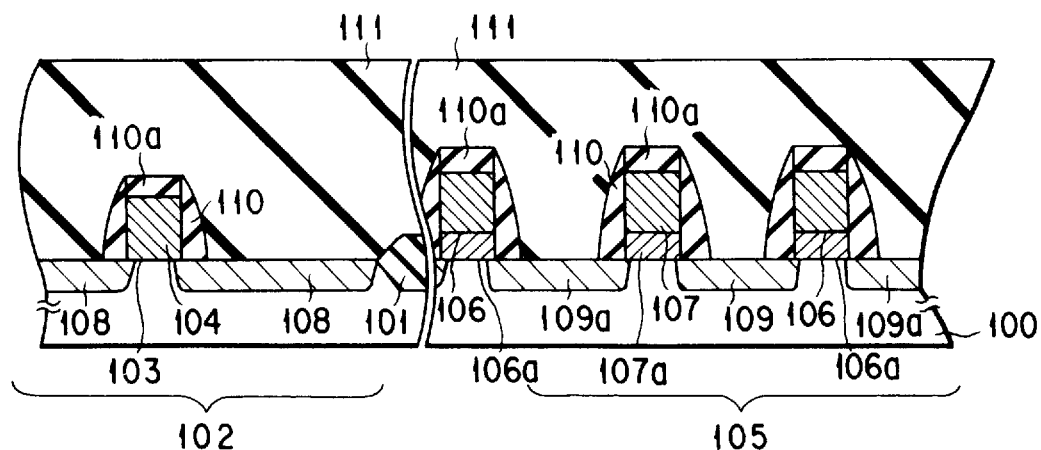
F I G. 1
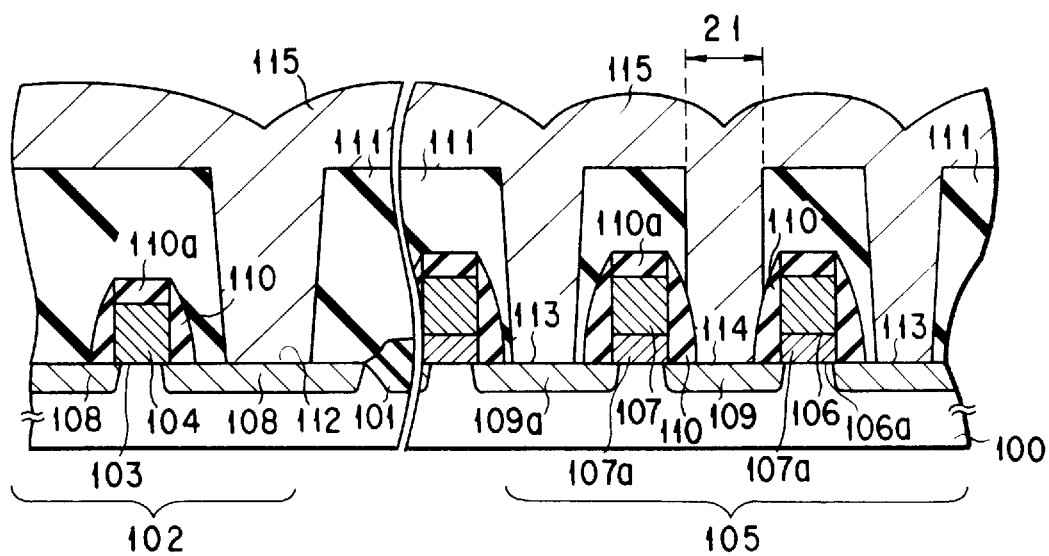
F I G. 2

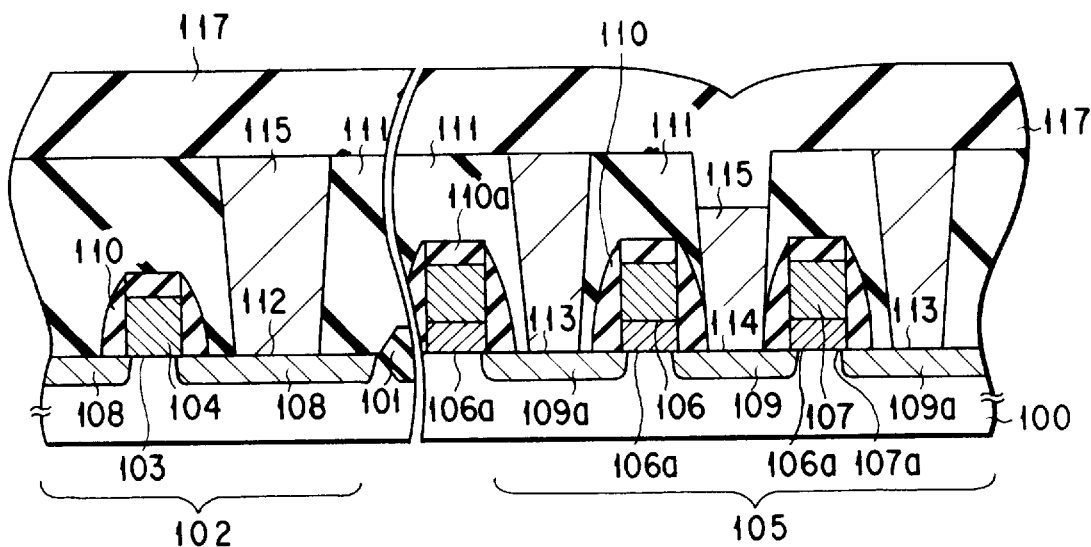
F I G. 5
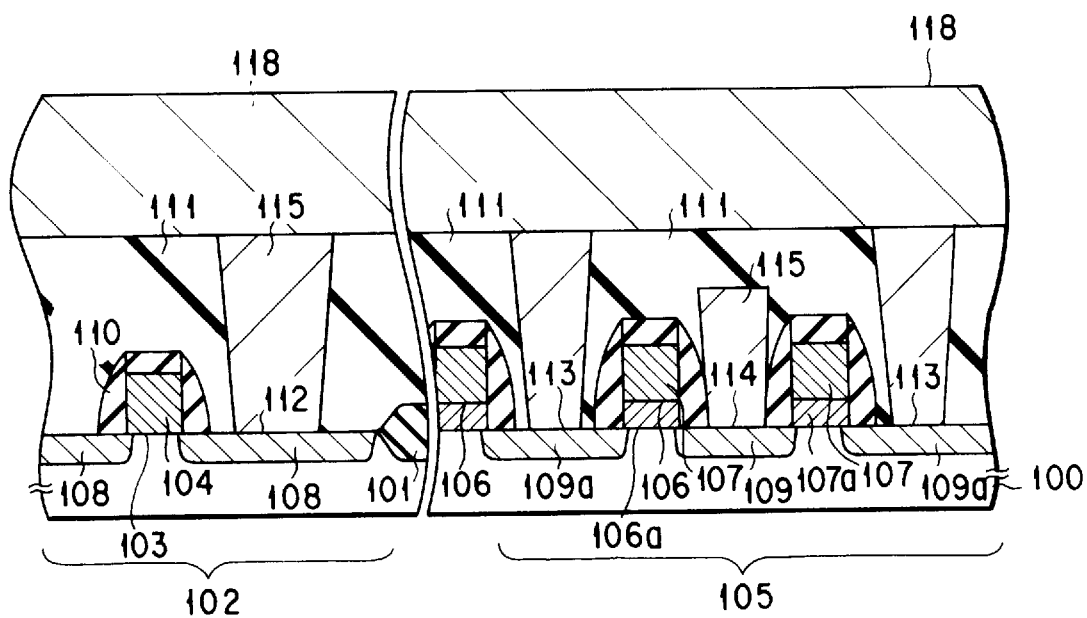
F I G. 6

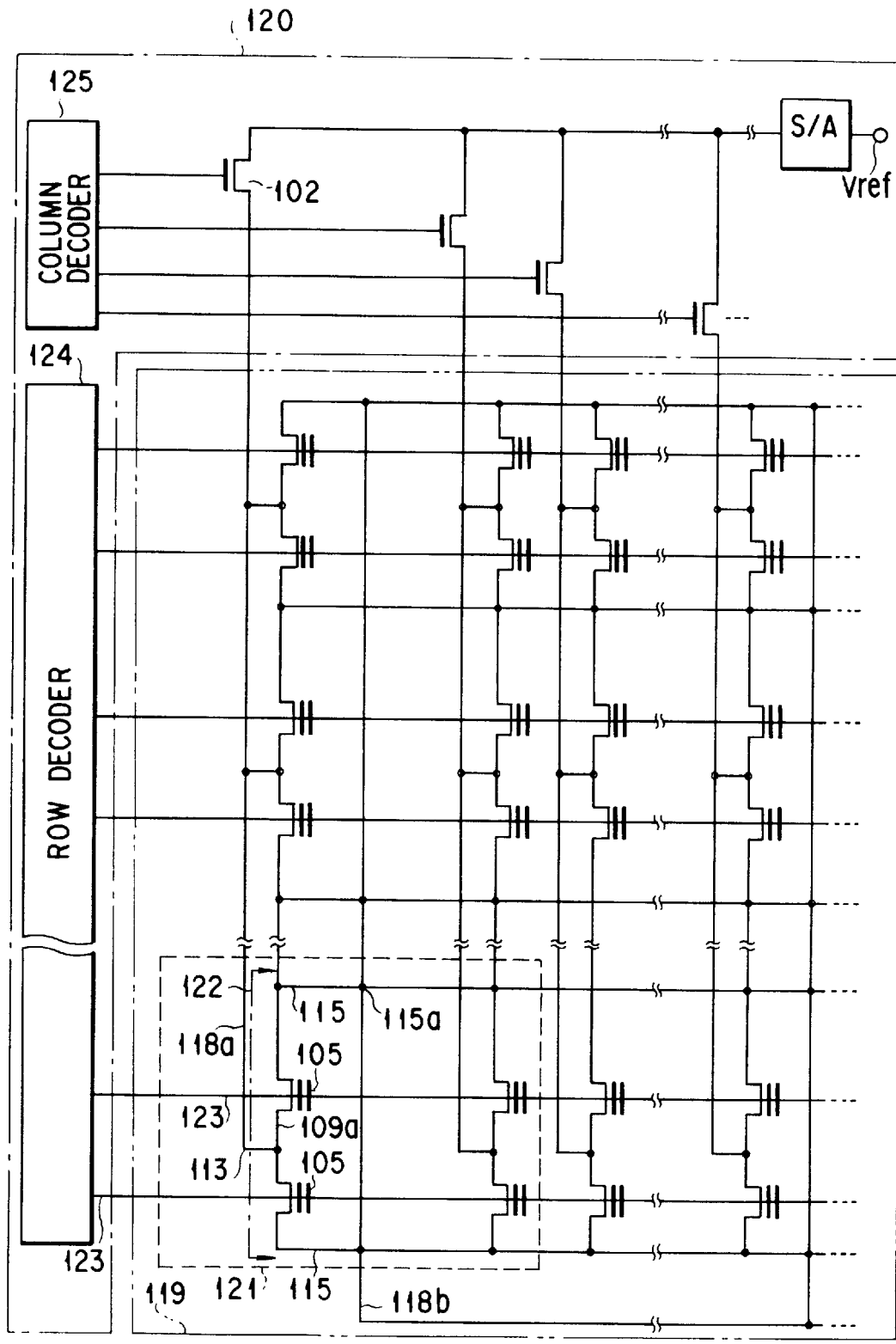
F I G. 8

NONVOLATILE SEMICONDUCTOR MEMORY DEVICE HAVING REDUCED SOURCE LINE RESISTANCE

BACKGROUND OF THE INVENTION

The present invention relates to a semiconductor memory device and a method of manufacturing the same and, more particularly, to an improvement in a nonvolatile semiconductor memory.

Semiconductor memories have been greatly developed in capacity, integration density, and operating speed. In particular, micropatterning of elements is an indispensable requirement. This is also true for EPROMs and EEPROMs each of which serves as a nonvolatile semiconductor memory device having a two-layered gate structure. In such a memory cell, the widths of each contact hole and each source diffusion layer have been reduced to realize micropatterning. A decrease in a contact hole inevitably results in an increase in contact resistance. Micropatterning of a source diffusion layer results in an increase in wiring resistance. The increases in contact and wiring resistances become a factor which interferes with the high-speed operations (read, program, and erase) of a memory cell. The increase in resistance of the source diffusion layer particularly results in a great decrease in cell current. This makes it difficult to read out data at a high speed. In addition, the increase in resistance of the source diffusion layer results in increases in stray capacitance and source potential. This makes it difficult to write or program data at a high speed.

In order to solve the above conventional problems, there has been employed a conventional technique for embedding a contact hole with a refractory metal such as tungsten or a silicide layer to reduce the resistance of the contact hole and similarly forming a refractory metal layer or its silicide layer on the source diffusion layer (the total resistance of the source diffusion layer and the metal layer formed thereon is referred to as a source resistance hereinafter).

A case wherein the above technique is applied to a nonvolatile memory cell transistor having a two-layered gate structure will be described below. The memory cell transistor has a multilayered gate structure in which a gate insulating film consisting of a gate insulating film, a floating gate, and an ONO film (oxide film/ nitride film/oxide film), and then a control gate are sequentially stacked on a p-type substrate. Such memory cell transistors are arrayed on the p-type substrate at a small pitch. N-type diffusion layers (source and drain diffusion layers) are formed in the substrate surface regions between the multilayered gate structures by ion implantation. An insulating side wall is formed on each multilayered gate structure. To connect the source/drain diffusion layer to a metal (refractory metal) to reduce the resistance in the above structure, a metal is deposited on the entire substrate surface including the gate structure. The metal then must be patterned by etching (RIE: Reactive Ion Etching). For example, a resist pattern is formed to have a shape for covering a source diffusion layer on the substrate surface which separates two memory cell transistors. This step is required to leave the metal on only the source diffusion layer in the subsequent etching step. In other words, since a drain diffusion layer connected to a bit line is connected to an upper metal layer through a contact hole, etching (RIE) for leaving the metal on only the source diffusion layer is therefore required.

The above conventional technique cannot meet the requirements for micropatterning, high-speed operations, and high reliability due to the following reasons. As described above, the metal must be left on the source diffusion layer between the memory cell transistors and must be etched and removed from other regions. In this case, the selectivity ratio of the metal to the underlying substrate cannot be sufficiently assured, and the underlying substrate surface is overetched. That is, a dip (damage) is formed in the surface of the drain diffusion layer of the memory cell transistor due to overetching. The drain resistance of the memory cell transistor increases to degrade the write characteristics. Similarly, since the source resistance is also increased in addition to the increase in drain resistance in the peripheral transistors, the conductance (Gm) is reduced to degrade the reliability of the device.

In order to eliminate this drawback, the damage to the underlying substrate during etching the metal must be minimized. As a countermeasure against this drawback, an implementation for maximally maintaining the selectivity in etching is also required, resulting in an increase in manufacturing cost. A field isolation portion and the gate portions of the memory cell transistors and peripheral transistors form large steps on the substrate. Even if a sufficiently high etching selectivity is realized for a metal film deposited on the entire surface of the substrate including the large steps, an overetching time is required so as not to insufficiently etch the local portions of the above steps. When the overetching time is prolonged, the surfaces of the drain diffusion layers of the memory cell transistor and peripheral transistors, all of which determine the reliability of the device, are exposed to an etching gas for a long period of time, damaging these surfaces. As a result, defects such as a decrease in Gm, degradation of hot carrier reliability, and gate breakdown caused by a charge-up phenomenon may occur. The state-of-the-art techniques are inevitably a technique for etching a metal using an etching gas for a high selectivity ratio regardless of a high cost, or a technique for minimizing the thickness of a metal film to be deposited so as to minimize the overetching time. As a matter of course, a decrease in thickness of the metal film results in an increase in resistance. This makes it difficult to meet the demand for sufficiently reducing the source wiring resistance.

BRIEF SUMMARY OF THE INVENTION

The present invention has been made in consideration of the above situation, and has as its object to provide a semiconductor device and a method of manufacturing the same, which are suitable for micropatterning and a high-speed operation with a high reliability.

This object is achieved by the following arrangement.

A nonvolatile semiconductor memory device comprises: a semiconductor substrate; an element isolation film on the semiconductor substrate; first and second gate electrodes formed above the semiconductor substrate to be spaced apart from each other by a predetermined distance; a first semiconductor region having a conductivity type opposite to that of the semiconductor substrate and formed in a surface region of the semiconductor substrate between the first and second gate electrodes; a second semiconductor region having the conductivity type opposite to that of the semiconductor substrate and formed in a surface region of the semiconductor substrate which is located on a side opposite to the first semiconductor region so as to interpose the first gate electrode of the first and second electrodes with the first semiconductor region; a third semiconductor region having the conductivity type opposite to that of the semiconductor substrate and formed in a surface region of the semiconductor substrate which is located on a side opposite to the first semiconductor region so as to interpose the second gate electrode of the first and second electrodes with the first semiconductor region; an insulating interlayer formed above the substrate so as to cover at least all the first semiconductor region, the second semiconductor region, the third semiconductor region, and the first and second gate electrodes; a first conductor and a second conductor formed on the insulating interlayer; a first electrode of a refractory metal for electrically connecting the second semiconductor region to the first conductor; a second electrode of a refractory metal for electrically connecting the third semiconductor region to the first conductor; and a third electrode of a refractory metal for electrically connecting the first semiconductor region to the second conductor, the third electrode being formed to cross below the first conductor so as to have an intermediate level of the insulating interlayer in a direction of thickness except for a contact portion with the second conductor.

A method of manufacturing a nonvolatile semiconductor memory device comprises: the step of forming first and second gate electrodes above a major surface of a semiconductor substrate to be spaced apart from each other by a predetermined distance; the step of diffusing an impurity having a conductivity type opposite to that of the semiconductor substrate to form a first semiconductor region in a surface region of the semiconductor substrate between the first and second gate electrodes, a second semiconductor region formed in a surface region of the semiconductor substrate which is located on a side opposite to the first semiconductor region so as to interpose the first gate electrode with the first semiconductor region, and a third semiconductor region in a surface region of the semiconductor substrate which is located on a side opposite to the first semiconductor region so as to interpose the second gate electrode with the first semiconductor region; the step of forming a first insulating interlayer above an entire major surface of the semiconductor substrate; the first etching step of forming, in the first insulating interlayer, contact holes so as to respectively correspond to the second and third semiconductor regions and a slit-like opening parallel to a formation direction of the first and second gate electrodes so as to correspond to the first semiconductor region; the step of depositing a refractory metal film on the entire major surface of the semiconductor substrate to embed the contact holes and the slit-like opening with the refractory metal film; the second etching step of etching back the refractory metal film to expose the first insulating interlayer; the third etching step of selectively etching the refractory metal film from the slit-like opening to an intermediate level except for a connecting region with an upper interconnection; and the step of embedding an etched portion in the third etching step with a second insulating interlayer.

According to the present invention, the adjacent upper interconnections are not adversely affected by electrical connections between upper and lower layers. The refractory metal film in the slit-like opening becomes a striped interconnection crossing the upper interconnection and can have a relatively large cross-section, which easily reduces the resistance of the first semiconductor region. The resultant structure is suitable for micropatterning and a high-speed operation, thus improving the reliability of the device. In etching the refractory metal film, the first insulating interlayer serves as a protective film thick enough to partially remove the refractory metal film.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is the first sectional view showing the step in manufacturing a nonvolatile semiconductor memory according to the present invention;

FIG. 2 is the second sectional view showing the step following the step in FIG. 1;

FIG. 5 is the fourth sectional view showing the step following the step in FIG. 4;

FIG. 6 is the fifth sectional view showing the step following the step in FIG. 5;

FIG. 8 is a circuit diagram for explaining the circuit arrangement of the memory cell group and its peripheral portion of a nonvolatile semiconductor memory manufactured using a manufacturing method of the present invention.

DETAILED DESCRIPTION OF THE INVENTION

Figure 3:
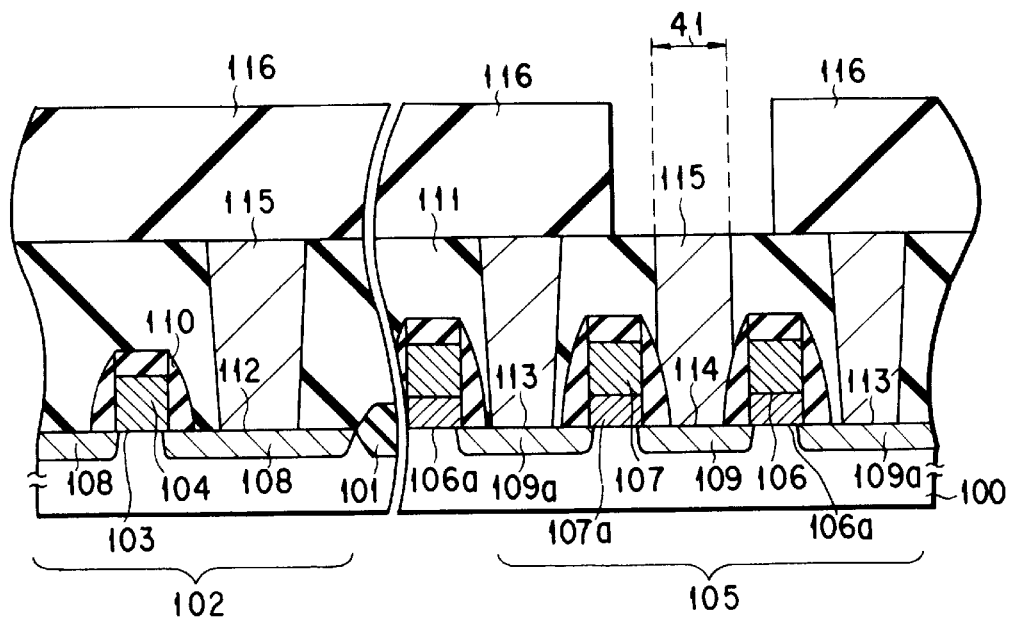
FIG. 3 is the third sectional view showing the step following the step in FIG. 2.

FIGS. 1 to 7 sequentially show the steps in manufacturing a nonvolatile semiconductor memory according to the present invention.

As shown in FIG. 1, an element isolation field oxide film 101 is formed on a p-type semiconductor substrate 100. Subsequently, a gate oxide film 103 and a gate electrode 104 of a peripheral transistor 102, and a gate insulating film 106 consisting of a gate oxide film 106a, a floating gate electrode 107a, and a ONO film (oxide film/nitride film/oxide film), and a control gate electrode 107 of each memory cell transistor 105 are formed. A cap layer 110a made of a nitride film or the like is formed on the control gate electrode 107. Source and drain diffusion layers 108 of the peripheral transistor 102 and source and drain diffusion layers 109 and 109a of each memory cell transistor 105 are then formed. An insulating film (e.g., a nitride film) is deposited on the entire surface of the substrate and etched by an anisotropic etching technique (e.g., RIE) to form side walls 110, respectively, on the gates of the peripheral and memory cell transistors 102 and 105. The cap layer 110a and the side walls 110 serve as insulating members for etching protection and short-circuiting prevention. Note that although only two memory cell transistors 105 are illustrated, a large number of memory cell transistors 105 are arrayed in the right-and-left direction and a direction of depth. Two adjacent ones of the plurality of memory cell transistors 105 arrayed in the right-and-left direction share the source or drain diffusion layer 109 or 109a. An insulating interlayer 111 is deposited on the entire surface of the substrate, and the surface of the insulating interlayer 111 is planarized using a technique such as CMP.

As shown in FIG. 2, the insulating interlayer 111 is etched using a resist pattern having a predetermined shape to form contact holes 112 for the source and drain diffusion layers 108 of the peripheral transistor 102 and a contact hole 113 for the drain diffusion layer 109a of each memory cell transistor 105. At the same time, a slit-like opening (to be referred to as a slit hereinafter) 114 extending in the direction of depth in FIG. 2 is formed on the source diffusion layer 109 between the two adjacent memory cell transistors 105. The width of this slit 114, i.e., a size 21 in FIG. 2 is smaller than the distance between the control gate electrodes 107 of the two illustrated memory cell transistors 105 but larger than the distance between the lower portions of the side walls 110 of the two adjacent memory cell transistors 105. A tungsten film 115 is then formed on the entire surface using CVD, thereby embedding the contact holes 112 and 113 and the slit 114 with the tungsten film 115.

Figure 4:
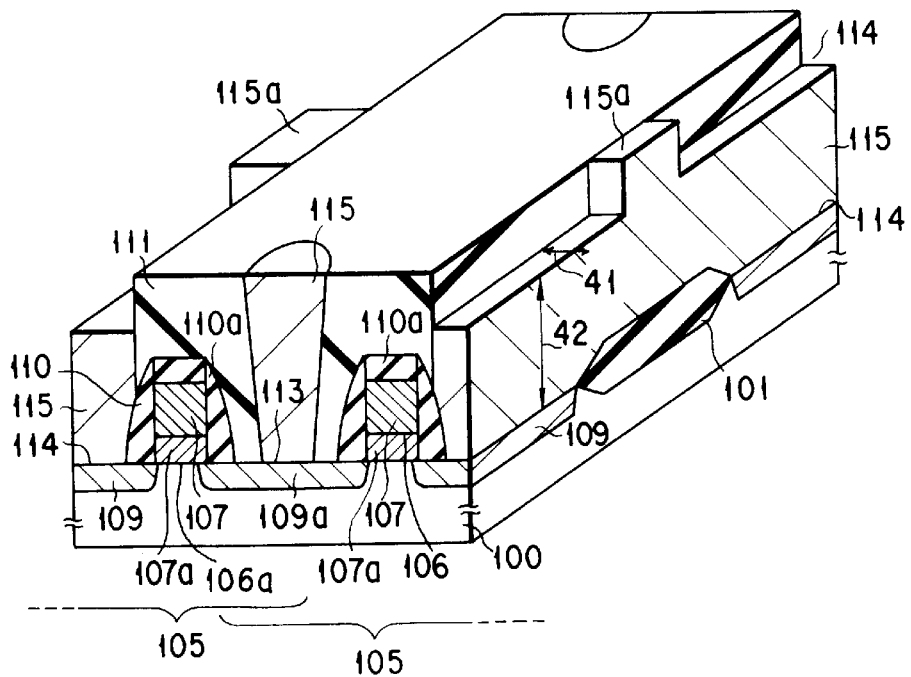
FIG. 4 is the first perspective sectional view of the main part of the present invention, showing the step following the step in FIG. 3.

As shown in FIG. 3, the tungsten film 115 is etched until the insulating interlayer 111 is exposed to the surface. At this time, the sectional shape of the tungsten film 115 filled in the contact holes 112 and 113 and the slit 114 is a columnar shape, as shown in FIG. 4. A resist pattern 116 is formed to have a shape to partially expose the slit 114. The tungsten film 115 is etched and removed by a predetermined thickness, using the resist pattern 116 as a mask.

FIG. 4 is a perspective sectional view showing the shape of the tungsten film 115 after the tungsten film 115 is etched by the predetermined thickness and the resist pattern 116 is removed. An upper portion 115a of part of the tungsten film 115 between the transistor 105 in FIG. 3 and a memory cell transistor (not shown) adjacent thereto in the direction of depth is exposed from the insulating interlayer 111. Therefore, the tungsten film 115 filled up to the intermediate level of the slit for the source diffusion layer of each memory cell transistor 105 is formed unlike in other contact holes.

Referring to FIG. 4, a width 41 (41 in FIG. 3) of the slit 114, i.e., the tungsten film 115, which is equal to the width of the uppermost portion between the gate electrodes 107, is preferably ½ or more a vertical depth 42 of the section of the tungsten film 115 to increase the sectional area and thus reduce the resistance. At this time, when the depth 42 is set to a value close to the thickness of the insulating interlayer 111 in order to increase the sectional area, the width 41 of the tungsten film 115 is set to about ½ the slit depth, i.e., the thickness of the insulating interlayer 111, and the same time the distance between the upper portions of the two gate electrodes 105 is set to about ½ the thickness of the insulating interlayer 111. Note that the etch-back amount of the tungsten film 115 may be increased within the above ranges. In this case, the capacitances of a wiring layer 118b (to be described later) and the tungsten film 115 are reduced, so that the resultant structure is suitable for a high-speed operation.

As shown in FIG. 5, an insulating film 117 is deposited on the entire major surface by CVD and then etched by RIE to planarize the surface. In the above etching, the surfaces of the tungsten layer 115 filled in the contact holes 112 and 113 are exposed. As shown in FIG. 6, an aluminum film 118 is deposited on the entire surface. The aluminum film 118 is patterned to form interconnections on the memory cell transistor side and the peripheral transistor 102 side.

Figure 7:
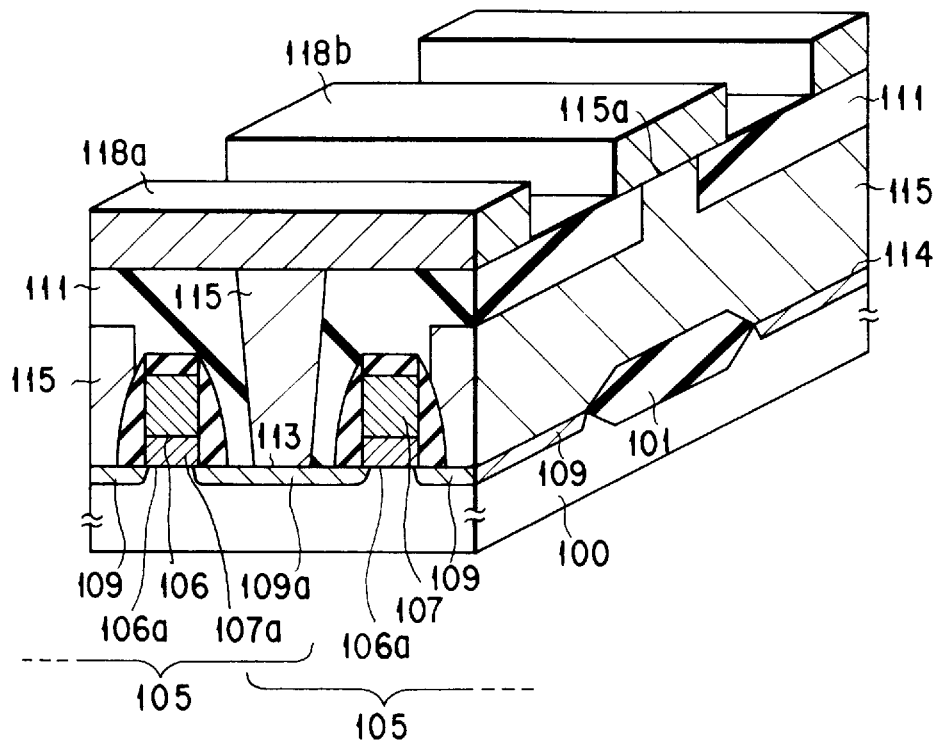
FIG. 7 is the second perspective sectional view of the main part of the present invention, showing the step following the step in FIG. 6.

FIG. 7 shows interconnections on the memory cell transistor side, which are obtained using the aluminum film 118.

A wiring layer 118a is a bit line connected to the drain diffusion layer of each memory cell transistor, and a wiring layer 118b is a source line connected to the source diffusion layer of each memory cell transistor. The source line 118b is connected to the upper portion 115a of part of the refractory metal 115 in the opening (slit) 114. After a passivation step, a nonvolatile semiconductor memory is finished.

FIG. 8 is a circuit diagram for explaining the circuit arrangement of a memory cell group 119 and a peripheral portion 120 of the nonvolatile semiconductor memory manufactured by the above manufacturing method. The portion shown in FIG. 7 corresponds to the circuit within a range 121 in FIG. 8. The front section in FIG. 7 corresponds to a section taken along a line 122. Note that the portions of the circuit in FIG. 8 which substantially correspond to the portions in FIG. 7 are denoted by the same reference numerals.

A plurality of transistors having the same structure as in the range 121 in FIG. 8 are arranged in a matrix in vertical and horizontal directions (to be referred to as row and column directions thereinafter) along the array of the two transistors 105 in FIG. 8.

The source diffusion layers of the plurality of column transistors 105 constituting the memory cell group are connected by the tungsten film 115. This tungsten film 115 is connected to the row source lines 118b at the portions 115a every, e.g., 64 transistors 105. These source lines 118b are connected to the tungsten film 115 in a region except for the region where the transistors 105 are formed. The source lines 118a and the tungsten films 115 in FIG. 8 are connected to each other to form a matrix. In this case, although the source line 118b is formed every 15 column transistors in the conventional case, the source line 118b is formed every 64 column transistors 105 in the present invention, thereby greatly reducing the number of source lines 118b.

Referring to FIG. 8, the control gate electrodes of the plurality of column transistors 105 are connected to each other to serve as a word line 123. The plurality of word lines 123 are connected to a row decoder 124. The plurality of contact holes 113 of the drains of the plurality of row transistors 105 are connected to the bit lines 118a, respectively. The bit lines 118a are connected to a column decoder 125 through the peripheral transistors 102. The peripheral transistors 102 are also connected to a voltage terminal Vref through a sense amplifier S/A.

In operating the nonvolatile semiconductor memory, a voltage of 5 V or 0 V is applied to the word lines 123 connected to the control gates, a voltage of 0 V is applied to the source lines 118b, and a voltage of 1 V is applied to the bit lines 118a through the peripheral transistors 102 and the sense amplifier S/A. In write access, a voltage of 10 V or 0 V is applied to the word lines, a voltage of 0 V is applied to the source lines, and a voltage of 10 V is applied to the bit lines. In erasure, a voltage of −5 V is applied to the word lines, and a voltage of 5 V is applied to the source lines.

According to the structure of the present invention, since the slit 114 and the contact holes, 112 and 113 in a region including the upper portions of the source diffusion layer 109 interposed between the two adjacent memory cell transistors 105 are embedded with a refractory metal such as tungsten, the contact and source resistances can be easily reduced, so that the structure is suitable for a high-speed operation. Since the upper portion of the tungsten film 115 in the slit 114 except for a connection region between the source line 118b and the tungsten film 115 in the slit 114, i.e., a region where the source line 118b is formed, is not exposed from the insulating interlayers 111 and 117, the source diffusion layer 109 and the bit line 118a are not short-circuited, and the source diffusion layer 109 and the source line 118b can be easily connected. The number of source lines 118b formed every ten and several bit lines 118a in the conventional structure can be reduced. This is effective in micropatterning an element. The chip area can be smaller than that of a conventional nonvolatile semiconductor memory if the number of recording bits is kept unchanged. In addition, since the thick insulating interlayer 111 serves as a protective film for a region required to remove the tungsten film 115 in etching the tungsten film 115, the underlying layer of the insulating interlayer 111 in this region, and particularly the drain diffusion layer 109a will not be damaged, thereby improving reliability of the device and increasing the yield of devices. The gate electrodes 104 and 107 can hardly be short-circuited with the wiring layers 118a and 118b to increase the yield of devices. In addition, since the slit 114 and the tungsten film 115 filled therein are formed simultaneously with the contact holes 112 and 113 and the tungsten film 115 filled therein, any other special step is not required. In the above step, since any SAS (Self-Aligned-Source) structure need not be used, a process having a small margin, i.e., strict manufacturing conditions can be omitted, thereby facilitating the manufacture of the above nonvolatile semiconductor memory.

The side wall 110 serves as a stopper in embedding for the tungsten film 115. That is, the side wall 110 is an insulating film such as an SiN (or SiO$_2$) film and functions to prevent damage to the gate of the memory cell transistor 105. If the distance between the slit 114 and the gate electrode (104, 107a, and 107) is assured to be 0.1 μm or more, the side wall 110 is not limited to the above form. In this case, the side wall formation step may be omitted. This is effective to reduce the cost.

The cap layer 110a on the gate electrode 107 may be a CVD-SiO$_2$ film in place of an SiN film. The cap layer 110a is effective when the slit 114 is formed above the gate electrode 107 by a mask alignment error. That is, the cap layer 110a serves as an etching stopper, thereby preventing short-circuiting between the gate electrode 108 and the source or bit line 118b or 118a. Therefore, the yield can be further increased, and finer micropatterning can be achieved.

As has been described above, according to the present invention, there can be provided a semiconductor device and a method of manufacturing the same, which are suitable for high reliability, micropatterning, and a high-speed operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A nonvolatile semiconductor memory device comprising:

a semiconductor substrate;

an element isolation film formed on said semiconductor substrate to define an element area;

first second, and third semiconductor regions formed in said element area, said first, second, and third semiconductor regions being spaced apart from each other and each having a conductivity type which is opposite to a conductivity type of said semiconductor substrate;

a first gate electrode insulatively spaced from a portion of said semiconductor substrate between said first and second semiconductor regions;

a second gate electrode insulatively spaced from a portion of said semiconductor substrate between said first and third semiconductor regions;

an insulating interlayer formed over at least said first and second gate electrodes;

a first conductor and a second conductor formed on said insulating interlayer, said first conductor and said second conductor each extending in the same first direction;

a first electrode for electrically connecting said second semiconductor region to said first conductor;

a second electrode for electrically connecting said third semiconductor region to said first conductor; and a third electrode formed in said insulating interlayer for electrically connecting said first semiconductor region to said second conductor, said third electrode extending in a second direction perpendicular to said first direction and being insulated from said first and second conductors except for a contact portion thereof which contacts said second conductor.

2. The device according to claim 1, further comprising a plurality of other first conductors arranged to extend parallel to said first conductor and a plurality of other second conductors arranged to extend parallel to said second conductor, said second conductors being arranged at particular intervals with respect to said first conductors.

3. The device according to claim 1, wherein said first and second gate electrodes and said first, second, and third semiconductor regions constitute two memory cells sharing said first semiconductor region.

4. The device according to claim 1, wherein said contact portion of said third electrode is formed above said element isolation film.

5. The device according to claim 1, wherein said third electrode is formed such that a width of an uppermost portion of said third electrode between said first and second gate electrodes is larger than ½ a size in a direction of depth.

6. The device according to claim 1, wherein one or more of said first, second, and third electrodes is formed of a refractory metal.

7. A device according to claim 6, wherein said first, second, and third electrodes essentially consist of the same refractory metal.

8. The device according to claim 1, wherein said first and second electrodes and said first, second, and third semiconductor regions constitute two memory cells in which said second and third semiconductor regions serve as drain regions, and said first semiconductor region serves as a common source region, said first conductor comprises a bit line, and said second conductor comprises a source line.

9. The device according to claim 8, wherein said memory cells are arranged in a NOR memory structure.

10. The device according to claim 8, wherein insulating side walls are formed on said first and second gate electrodes, respectively.

11. The device according to claim 8 wherein insulating cap layers are formed on upper portions of said first and second gate electrodes, respectively.

12. The device according to claim 8, wherein said first and second gate electrodes of said two memory cells each includes a charge storage layer and a control gate, and an insulating film having a three-layered structure consisting of a first oxide film, a nitride film, and a second oxide film is formed between said charge storage layer and said control gate of said first and second gate electrodes.

13. The device according to claim 8, further comprising a plurality of other first conductors arranged to extend parallel to said first conductor and a plurality of other second conductors arranged to extend parallel to said second conductor, said second conductors being arranged at particular intervals with respect to said first conductors.

14. A nonvolatile semiconductor memory device comprising:
   a semiconductor substrate;
   a memory cell group comprising a plurality of transistor pairs, each transistor pair comprising a common source diffusion layer and first and second drain diffusion layers, a first gate electrode insulated from a portion of said semiconductor substrate between said common source diffusion layer and said first drain diffusion layer; and a second gate electrode insulated from a portion of said semiconductor substrate between said common source diffusion layer and said second drain diffusion layer, each of said first and second gate electrodes comprising a charge storing layer for storing a charge and a control gate, the control gates of said gate electrodes being connected to each other in a row direction perpendicular to a column direction of an array of said transistor pairs, said connected control gates constituting a plurality of word lines;
   an insulating interlayer formed above said memory cell group;
   a plurality of bit lines formed on said insulating interlayer said bit lines extending in the column direction;
   at least one source line arranged to extend parallel to at least one of said plurality of bit lines;
   a plurality of columnar first electrodes for connecting said drain diffusion layers of said memory cell group and said bit lines; and
   at least one second electrode formed in said insulating interlayer, said at least one second electrode electrically connecting the common source diffusion layers between two adjacent rows of said memory cell group to said at least one source line, said at least one second electrode extending in the row direction and being insulated from said bit lines and said at least one source line except for contact portions thereof which contact said at least one source line.

15. The device according to claim 14, wherein said bit lines are parallel to each other, said at least one source line comprises a plurality of source lines parallel to each other, and said source lines are arranged at a particular interval with respect to said plurality of bit lines.

16. The device according to claim 14, wherein insulating side walls are formed on said first and second gate electrodes, respectively.

17. The device according to claim 14, wherein insulating cap layers are formed on upper portions of said first and second gate electrodes, respectively.

18. The device according to claim 14, wherein said charge storing layer and said control gate of each of said first and second gate electrodes are insulatively spaced apart by an insulating film having a three-layered structure consisting of a first oxide film, a nitride film, and a second oxide film.

19. The device according to claim 14, wherein said second electrode is formed such that a width of an uppermost portion of said second electrode between said first and second gate electrodes is larger than ½ a size in a direction of depth.

20. A device according to claim 14, wherein said first and second electrodes consist essentially of the same refractory metal.

21. The device according to claim 14; wherein said charge storing layer comprises a floating gate electrode.

22. A nonvolatile semiconductor memory device comprising:
   a semiconductor substrate;
   an element isolating film formed on said semiconductor substrate to define element areas;
   memory cells arranged in rows and columns, each memory cell comprising first and second current terminals formed in one of said elements areas, a charge accumulating layer, and a control gate;
   first conductors each extending in the column direction;
   first electrodes for connecting the first current terminals of said memory cells to said first conductors;
   second conductors each extending in the column direction; and
   second electrodes each extending in the row direction and connecting together the second current terminals of the memory cells in at least one corresponding row of said memory cells, each second electrode having at least one contact portion which contacts one of said second conductors.

23. The device according to claim 22, wherein the contact portions of said second electrodes are located above said element isolating film.

24. The device according to claim 22, wherein portions of said second electrodes other than the contact portions thereof are insulated from said first and second conductors.

25. The device according to claim 22, wherein an upper width of said second electrodes is greater than or equal to one-half of a thickness of said second electrodes above the second current terminals of said memory cells.

26. A semiconductor memory device comprising:
   memory cells arranged in rows and columns on a semiconductor substrate, each memory cell comprising a field effect transistor including a source region, a drain region, a charge accumulating layer insulated from a channel region between said source region and said drain region, and a control gate insulated from said charge accumulating layer;
   an interlayer insulating film;
   bit lines, said bit lines extending in the column direction;
   source lines;
   contact holes formed in said interlayer insulating film to expose the drain regions of said memory cells;
   bit line contacts formed in said contact holes for electrically connecting the drain regions of said memory cells to said bit lines;
   slits formed in said interlayer insulating film, each slit extending in the row direction and exposing source regions of said memory cells; and
   a conductive film formed in said slits, said conductive film including first portions above the source regions and second portions above the spaces between the source regions, wherein said first portions have first upper surface level and at least some of said second portions have a second different upper surface level, and
   said second portions of said conductive film having the second upper surface level are in contact with corresponding ones of said source lines.

27. The device according to claim 26 wherein said charge accumulating layers of said memory cells comprise floating gate electrodes.

28. The device according to claim 26, wherein an upper width of said first portions of said conductive film is equal to or greater than one-half of a thickness of said first portions of said conductive film.

29. The device according to claim 26, wherein a thickness of said first portions of said conductive film is close to a thickness of said interlayer insulating film and an upper width of said first portions of said conductive film is about one-half the thickness of said first portions of said conductive film.

30. The device according to claim 26, wherein said bit lines are insulated from the first portions of said conductive film by said interlayer insulating film.

31. The device according to claim 26, wherein each of said memory cells further comprise insulating sidewalls formed on the charge accumulating layer and the control gate electrode thereof and a width of said slits in said interlayer insulating film is less than a spacing between the control gate electrodes of memory cells in adjacent rows of said memory cell array and larger than the spacing between lower portions of the insulating sidewalls of memory cells in adjacent rows of said memory cell array.

32. The device according to claim 26, wherein said bit line contacts and said conductive film are formed of a refractory metal.

33. The device according to claim 26, wherein said source lines extend in the column direction.

34. The device according to claim 26, wherein said source lines are formed at intervals of less than one for every 15 columns of said memory cell array.

35. The device according to claim 34, wherein said source lines are formed at intervals of one for every 64 columns of said memory cell array.

36. A nonvolatile semiconductor memory device comprising:
   a semiconductor substrate;
   an element isolating film formed on said semiconductor substrate to define element areas;
   memory cells arranged in rows and columns, each memory cell comprising first and second current terminals formed in one of said elements areas, a charge accumulating layer, and a control gate;
   bit lines each extending in the column direction;
   first electrodes for connecting the first current terminals of said memory cells to said bit lines; and
   second electrodes each extending in the row direction and connecting together the second current terminals of the memory cells in at least one corresponding row of said memory cells, an upper width of said second electrodes being greater than or equal to one-half of a thickness of said second electrodes above the second current terminals of said memory cells.

* * * * *

UNITED STATES PATENT AND TRADEMARK OFFICE
CERTIFICATE OF CORRECTION

PATENT NO.: 5,838,615

DATED: November 17, 1998

INVENTOR(S): Eiji KAMIYA et al.

It is certified that an error appears in the above-identified patent and that said Letters Patent is hereby corrected as shown below:

On the title page, add item [73]

-- Assignee: Kabushiki Kaisha Toshiba, Kawasaki-shi, Japan --

On the title page, item [76] should be changed to --[75]

Signed and Sealed this

Twenty-fifth Day of July, 2000

*Attest:*

Q. TODD DICKINSON

*Attesting Officer*          *Director of Patents and Trademarks*